(12) United States Patent
Werhane et al.

(10) Patent No.: US 11,054,468 B2
(45) Date of Patent: Jul. 6, 2021

(54) SEGMENTED DIGITAL DIE RING

(71) Applicant: Micron Technology, Inc., Boise, ID (US)

(72) Inventors: Kevin G. Werhane, Kuna, ID (US); Nathaniel J. Meier, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 414 days.

(21) Appl. No.: 15/993,364

(22) Filed: May 30, 2018

(65) Prior Publication Data

US 2019/0369163 A1    Dec. 5, 2019

(51) Int. Cl.
*G01R 31/317*    (2006.01)
*H01L 21/00*    (2006.01)
*G09G 1/00*    (2006.01)

(52) U.S. Cl.
CPC . *G01R 31/31713* (2013.01); *G01R 31/31707* (2013.01)

(58) Field of Classification Search
CPC ... G01R 1/00; B23K 1/00; B23K 5/00; B23K 9/00; G01N 1/00; G01N 2201/00; H01L 21/00; H01L 2221/00; G06F 1/00; G06F 2101/00; G09G 1/00
See application file for complete search history.

(56) References Cited

U.S. PATENT DOCUMENTS

| | | | | |
|---|---|---|---|---|
| 2006/0279321 A1* | 12/2006 | Ruppender | ............ | G09G 3/006 324/750.3 |
| 2006/0282730 A1* | 12/2006 | Arai | ............... | G01R 31/318544 714/726 |
| 2008/0056025 A1* | 3/2008 | Kanagawa | .......... | G06F 11/1044 365/189.15 |
| 2014/0013171 A1* | 1/2014 | Lim | .................... | G01R 31/3187 714/724 |
| 2016/0155712 A1* | 6/2016 | Gietler | ............... | G01R 31/2831 257/48 |
| 2018/0145002 A1* | 5/2018 | Munder | .................. | H01L 22/34 |

* cited by examiner

*Primary Examiner* — Jermele M Hollington
*Assistant Examiner* — Temilade S Rhodes-Vivour
(74) *Attorney, Agent, or Firm* — Holland & Hart LLP

(57) ABSTRACT

Methods, systems, and devices for testing a die using a segmented digital die ring are described. A segmented digital die ring may include multiple signal line segments, each coupled with a test segment circuit, and a control circuit. A test segment circuit may generate a digital feedback signal that indicates a condition of a respective signal line segment. The control circuit may generate a single output signal, indicative of the condition of the signal line segments. By utilizing digital testing circuitry and a single digital output signal, a layout area of the segmented digital die ring be minimized and a power consumption associated with the testing operation may be reduced.

19 Claims, 8 Drawing Sheets

SEGMENTED DIGITAL DIE RING

BACKGROUND

The following relates generally to determining a condition of a die and more specifically to determining a condition of a die using a segmented digital die ring.

In the context of integrated circuits, a die is a portion of a wafer (e.g., a silicon wafer) upon which one or more circuits may be fabricated. Memory devices are one example of a type of integrated circuit that may be fabricated upon a die. Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Memory devices and other types of integrated circuits are typically fabricated on semiconductor materials and are created using semiconductor manufacturing processes. During the manufacturing processes, several of the same integrated circuits are formed on wafers of semiconductor materials concurrently, and are then separated into individual semiconductor dies. Each of the dies represents a separate semiconductor device, which may be separately packaged and included in a larger electronic system. Examples of semiconductor devices include memory devices, multiprocessor devices, power semiconductor devices, and many others. With regards to memory devices, various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Such memory devices may be produced as an integrated circuit on a semiconductor die. The semiconductor die may be sliced, cut, or "diced" from a wafer of semiconductor material Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
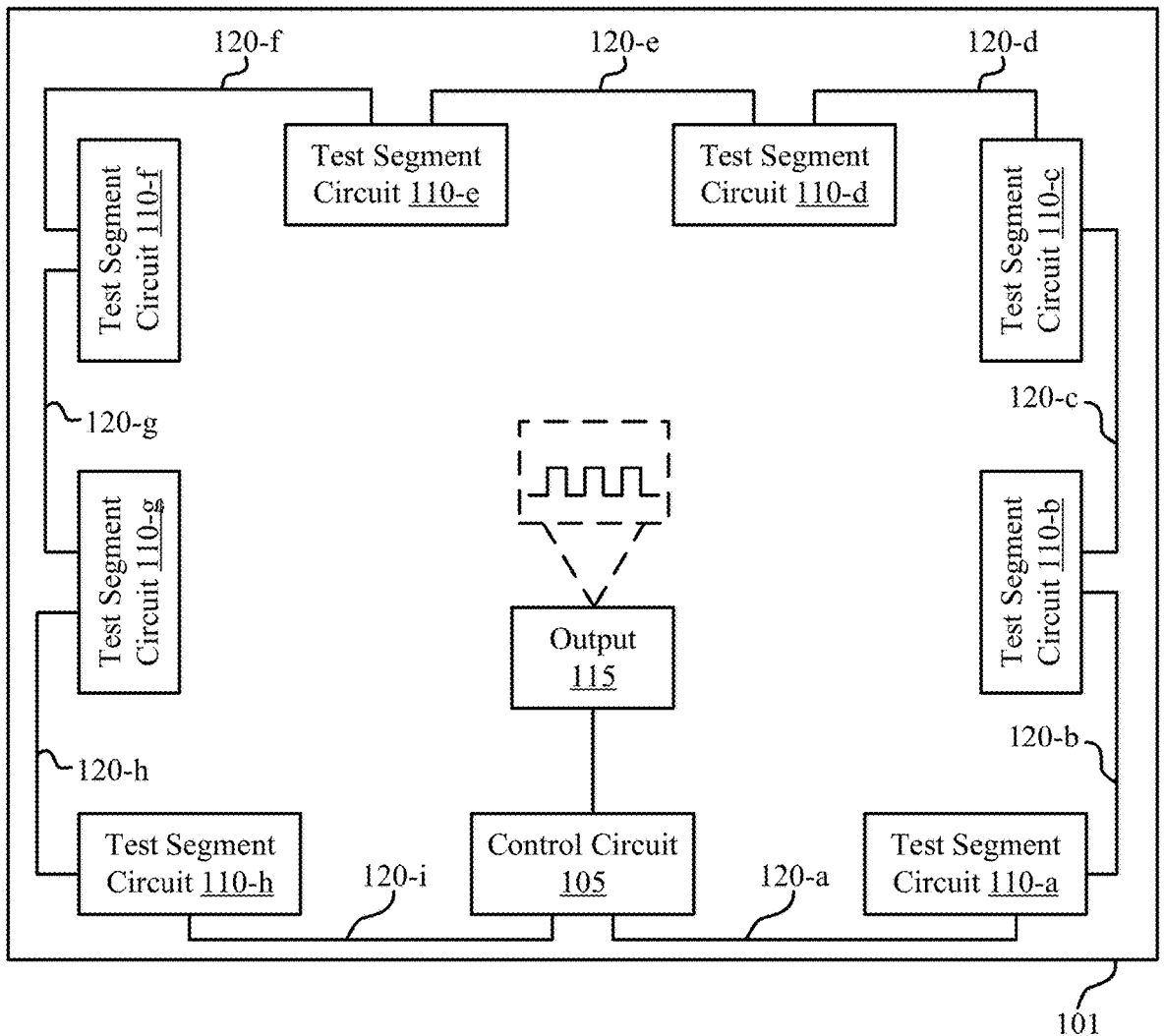
FIGS. 1 and 2 illustrate an example of a segmented digital die ring in accordance with examples of the present disclosure.

Some integrated circuits are fabricated on semiconductor materials and are created using semiconductor manufacturing processes that yield several integrated circuits formed on a single wafer. The wafer may be further fabricated (e.g., sliced or otherwise severed) into individual semiconductor dies. Due to the nature of the semiconductor materials, as well as the process that fabricates (e.g., severs from a wafer) multiple dies (e.g., concurrently), the dies may be susceptible to defects (e.g., cracks). For example, the fabrication process may produce stress on a respective edge of two dies cut from the same wafer. Such stress may lead to a crack in the respective edge of one or both of those dies. Detecting defects in a die is challenging in some cases because visually inspecting the wafers for cracks in the die may be prohibitively slow and may not be not practical for large-scale production. Additionally, defects in the die may not be visually apparent (e.g., may only be visually apparent under stress, may be too small, may exist along a line feature and may not be easily detectable). Accordingly, a need exists for structures and techniques for detecting defects in a die that may be scaled to account for more effective and efficient production of dies.

In some cases, continuous rings (e.g., continuous conductive rings) have been formed on the outer edges of dies to determine whether defects exist in a respective die. However, detecting defects using such rings may require the generation of one or more analog test signals, which is often both a time and power consuming process. Additionally, the components associated with generating analog test signals may require components (e.g., transistors) with large voltage tolerances, which may consume a large portion of the die area. Accordingly, digital solutions for detecting defects of a die are desirable.

Techniques are described herein for using a segmented digital die ring to determine defects (e.g., cracks) in a die (e.g., a memory die). For example, to determine the existence and/or location of a crack in a die, the segmented die ring may include a control circuit coupled with multiple test segment circuits and separate signal line segments positioned around the perimeter of the die. Each test segment circuit may include a multiplexer configured to selectively route to the control circuit a feedback signal indicating a condition of one or more signal line segments located between the test segment circuit and the control circuit or couple the one or more signal line segments located between the test segment circuit and the control circuit with one or signal line segments further removed from the control circuit.

The feedback signals may be routed to the control circuit, which may generate a single digital output signal that indicates whether a defect is located at or around a particular signal line segment, or whether the die is free from any cracking. By using a digital testing process, a testing process may take less time, and the die ring may consume less power (e.g., as opposed to a testing process using an analog signal). Additionally or alternatively, components associated with the generation of a single digital output signal may consume a smaller portion of the die (e.g., as opposed to a testing process using an analog signal).

Features of the disclosure introduced above are further described below in the context of FIGS. 1 through 4. These and other features of the disclosure are further illustrated by and described with reference to apparatus diagrams, system diagrams, and flowcharts that relate to techniques for segmenting a digital die ring.

FIG. 1 illustrates an example of a segmented digital die ring 100 in accordance with examples of the present disclosure. The segmented digital die ring 100 is fabricated on a die 101, on which one or more other circuits may be fabricated. In some cases, the die 101 may be a memory die. The segmented digital die ring 100 includes control circuit 105, any number of test segment circuits 110 (e.g., test segment circuits 110-a, 110-b, 110-c, 110-d, 110-e, 110-f, 110-g, and 110-h), and output 115. In some examples, output 115 may be referred to as output signal 115. The segmented digital die ring 100 may also include any number of signal line segments 120 (e.g., signal line segments 120-a, 120-b, 120-c, 120-d, 120-e, 120-f, 120-g, 120-h, and 120-i). Each of the signal line segments 120 may couple a test segment circuit 110 with an adjacent test segment circuit 110, or in the case of a test segment circuit 110 that is adjacent to the control circuit 105, may couple a test segment circuit 110 with the control circuit 105. For example, signal line segment 120-a may couple control circuit 105 with test segment circuit 110-a, and signal line segment 120-b may couple test segment circuit 110-a with test segment circuit 110-b.

In some examples, the segmented digital die ring 100 includes a control circuit 105 that may be coupled with one or more test segment circuits 110 (e.g., test segment circuits 110-a, 110-b, 110-c, 110-d, 110-e, 110-f, 110-g, and 110-h), directly or indirectly, via one or more signal line segments 120 (e.g., signal line segments 120-a, 120-b, 120-c, 120-d, 120-e, 120-f, 120-g, 120-h, and 120-i). The control circuit 105 may be configured to generate and transmit to test segment circuits 110 one or more signals for determining whether a defect (e.g., a crack) exists in the die 101. For example, the control circuit 105 may transmit an enable signal and/or a clock signal to one or more of the test segment circuits 110 to determine whether a defect exists. An enable signal may be referred to as a digital segment selection signal, for example, and may enable a test segment circuit 110 upon reaching the test segment circuit 110. Additionally or alternatively, a clock signal may clock the operation of the control circuit 105 and the one or more test segment circuits 110.

Each of the test segment circuits 110 (e.g., test segment circuits 110-a, 110-b, 110-c, 110-d, 110-e, 110-f, 110-g, and 110-h) may be formed along an edge of the die 101, such that defects along the perimeter of the die 101 may be detected. By placing multiple test segment circuits 110 along the outer edges of die 101, defects in the die 101 may be more efficiently and more accurately located (e.g., which signal line segment 120 is associated with the defect may be more precisely determined). By more effectively locating defects in the die 101, the cause of the defects may be understood and remedied. For example, the process of detecting defects in the die 101 may prevent further defects from being caused in other dies using the same or similar fabrication processes. Accordingly, the layout of segmented digital die ring 100 may be utilized to detect defects in the die, for example, generated by a particular manufacturing process of the die (e.g., blade dicing, laser cutting, etching), or by some other irregularity in the die.

As described above, the control circuit 105 may be coupled with one or more test segment circuits 110 (e.g., test segment circuits 110-a, 110-b, 110-c, 110-d, 110-e, 110-f, 110-g, and 110-h) via one or more signal line segments 120 (e.g., signal line segments 120-a, 120-b, 120-c, 120-d, 120-e, 120-f, 120-g, 120-h, and 120-i). The number of test segment circuits 110 and signal line segments 120 used may depend on a size of the die 101 and/or the accuracy or precision with which a defect is to be detected along a specific portion of the die 101. For example, utilizing additional test segment circuits 110 on a die 101, a location of the defect may be detected more accurately or precisely because each signal line segment 120 (e.g., signal line segments 120-a, 120-b, 120-c, 120-d, 120-e, 120-f, 120-g, 120-h, and 120-i) may cover a smaller portion of the die 101.

By way of example, test segment circuit 110-a may be referred to as a first test segment circuit 110-a and test segment circuit 110-b may be referred to as a second test segment circuit 110-b. Signal line segment 120-a may be referred to as a first signal line segment 120-a and signal line segment 120-b may be referred to as a second signal line segment 120-b. To determine a condition of the first signal line segment 120-a and/or the second signal line segment 120-b, the control circuit 105 may first transmit a clock cycle and an enable signal to the first test segment circuit 110-a. In some examples, the clock cycle and the enable signal may be transmitted in a first direction (e.g., in a counterclockwise direction; away from the control circuit 105). The first test segment circuit 110-a may be configured to generate a feedback signal based on receiving the enable signal, and the first test segment circuit 110-a may be configured to transmit the feedback signal to the control circuit 105 in a second direction (e.g., towards the control circuit 105).

In order to generate the first feedback signal, the first test segment circuit 110-a may first isolate the first signal line segment 120-a from the second signal line segment 120-b. After isolating the signal line segments 120-a, 120-b, the test segment circuit 110-a may generate a feedback signal indicative of a condition of the first signal line segment 120-a, and transmit the feedback signal to the control circuit 105 via the first signal line segment 120-a. In some examples, the feedback signal may indicate a first state or a second state of the first signal line segment 120-a. The first state may, for example, indicate the existence of a defect (e.g., a crack) associated with the first signal line segment 120-a and the second state may indicate the absence of a defect associated with the first signal line segment 120-a.

In some examples, each of the test segment circuits 110 (e.g. test segment circuits 110-a, 110-b, 110-c, 110-d, 110-e, 110-f, 110-g, and 110-h) may include a multiplexer. Each multiplexer may aid in selectively isolating or coupling signal line segments coupled with a same test segment circuit. For example, test segment circuit 110-a may include a multiplexer that, depending upon the state of a selection signal, which may be based on the enable signal, may either couple the first signal line segment 120-a with the second signal line segment 120-b or route a feedback signal (e.g., a digital feedback signal) to control circuit 105 and thus ultimately to output 115.

As discussed above, the control circuit 105 may receive a feedback signal from the first test segment circuit 110-a that indicates a condition of the first signal line segment 120-a. The feedback signal may indicate, for example, that a defect exists in the die 101 along (e.g., near to) first signal line segment 120-a, or that no defect exists in the die 101 along (e.g., near to) first signal line segment 120-a. Control circuit 105 may be coupled with and control output 115. If a defect exists, output 115 may indicate such by outputting a "low" (e.g., 0V) signal. If a defect does not exist along first signal line segment 120-a, output 115 may indicate such by outputting a "high" (e.g., 1V) signal, and the control circuit 105 may transmit an enable signal to second test segment circuit 110-b.

When an enable signal is transmitted to a subsequent signal line segment (e.g., repeated by first test segment circuit 110-a to second signal line segment 120-b) a multiplexer associated with a preceding test segment circuit 110 may couple the subsequent and preceding signal line segments 120. For example, to determine whether a defect exists along second signal line segment 120-b, control circuit 105 may transmit an enable signal to first test segment circuit 110-*a*, and first test segment circuit 110-*a* may relay the enable signal to second test segment circuit 110-*b*, and a multiplexer associated with first test segment circuit 110-*a* may couple first signal line segment 120-*a* with the second signal line segment 120-*b*.

Accordingly, as described above, a multiplexer associated with the second test segment circuit 110-*b* may selectively isolate the second signal line segment 120-*b* from signal line segment 120-*c* (e.g., a third signal line segment). Second test segment circuit 110-*b* may generate a feedback signal associated with a condition of the second signal line segment 120-*b* and transmit the feedback signal to the control circuit 105. The multiplexer associated with the first test segment circuit 110-*a* may route the feedback signal from the second signal line segment 120-*b* to the first signal line segment 120-*a*, and ultimately to the control circuit 105. Accordingly, each multiplexer associated with a respective test segment circuit 110 may selectively isolate a preceding and subsequent signal line segment, and route a feedback signal (e.g., a return feedback signal) from a subsequent signal line segment 120 to a preceding signal line segment 120. Thus, the control circuit 105 may receive a feedback signal from test segment circuit 110-*b* that indicates a condition of the second signal line segment 120-*b*.

As discussed above with respect to the first signal line segment 120-*a*, the feedback signal may indicate that a defect exists in the die 101 along (e.g., near to) second signal line segment 120-*b*, or that no defect exists in the die 101 along (e.g., near to) second signal line segment 120-*b*. If a defect exists, output 115 may indicate such by outputting a "low" (e.g., 0V) signal. If a defect does not exist along second signal line segment 120-*b*, output 115 may indicate such by outputting a "high" (e.g., 1V) signal, and the control circuit 105 may transmit an enable signal to an additional test segment circuit (e.g., to test segment circuit 110-*c*). Thus, by way of example, after determining whether a defect exists with the second signal line segment 120-*b*, output 115 may output a respective signal level for each signal line segment. Stated another way, output 115 may output a single signal with a state that changes over time. For example, the signal may toggle between a "low" and a "high" voltage to indicate whether a defect exists in relation to a particular segment, where a "high" voltage indicates that no defect exists. In other examples, a "low" voltage may indicate that no defect exists, and a "high" voltage may indicate the existence of a defect.

In some examples, the process described above may continue in a sequential order for each test segment circuit associated with die 101. The testing process may continue and a feedback signal associated with each signal line segment 120 may indicate that no defect exists along the respective signal line segment 120. In some cases, the testing process may cease once a defect is determined, or may proceed in a different direction around the segmented digital die ring 100 until all other signal line segments 120 have been tested or an additional defect is determined. Once each signal line segment 120 has been tested, control circuit 105 may cease transmitting enable signals, and the testing process may end. In some examples, the output signal may remain "high," indicating that no defects exist along the die 101.

As described in greater detail below, the test operations of the test segment circuits 110 (e.g., test segment circuits 110-*a*, 110-*b*, 110-*c*, 110-*d*, 110-*e*, 110-*f*, 110-*g*, and 110-*h*) may determine a defect associated with a signal line segment 120 coupled with the respective test segment circuit 110.

The test segment circuits 110 may be operated in conjunction with the control circuit 105 and output 115 to determine whether defects exist along the edges of the die 101. For example, output 115 may generate a single output signal (e.g., a single digital output signal, whose state may vary over time as feedback signals from each test segment circuit 110 are received by the control circuit 105) based on one or more test segment circuits 110 determining whether a defect exists in associated signal line segments 120. Stated another way, a single output may be generated based on the control circuit 105 receiving a plurality of feedback signals from a plurality of test segment circuits 110.

In some examples, the output signal may be a single, digital signal. The components of a test segment circuit (e.g., test segment circuits 110-*a*, 110-*b*, 110-*c*, 110-*d*, 110-*e*, 110-*f*, 110-*g*, and 110-*h*) and control circuit 105 may be made up of circuitry designed to carry out their respective functions. This may include various circuit elements, for example, conductive lines, transistors, capacitors, inductors, resistors, amplifiers, multiplexers, latches, flip-flops, logic gates, or other active or inactive elements, configured to carry out the functions described herein.

In some examples, the testing process as described above may occur in multiple directions. For example, control circuit 105 may first transmit an enable signal to signal line segment 120-*a*, and testing may proceed in a counterclockwise direction (e.g., ending with signal line segment 120-*i*). In other examples, control circuit 105 may first transmit an enable signal to signal line segment 120-*i*, and testing may proceed in a clockwise direction (e.g., ending with signal line segment 120-*a*). Additionally or alternatively, control circuit 105 may configure testing to proceed in multiple directions—e.g., in a second direction after determining a defect associated with a respective signal line segment 120 while testing in a first direction. For example, if control circuit 105 were to determine a defect associated with second signal line segment 120-*b* while proceeding in a counterclockwise direction, the condition of the die 101 associated with signal line segments 120-*c*, 120-*d*, 120-*e*, 120-*f*, 120-*g*, 120-*h*, and 120-*i* may be unknown. However, in some examples, control circuit 105 may transmit an enable signal to signal line segment 120-*i* and proceed in a clockwise direction to determine the condition of such signal line segments 120.

Figure 2:
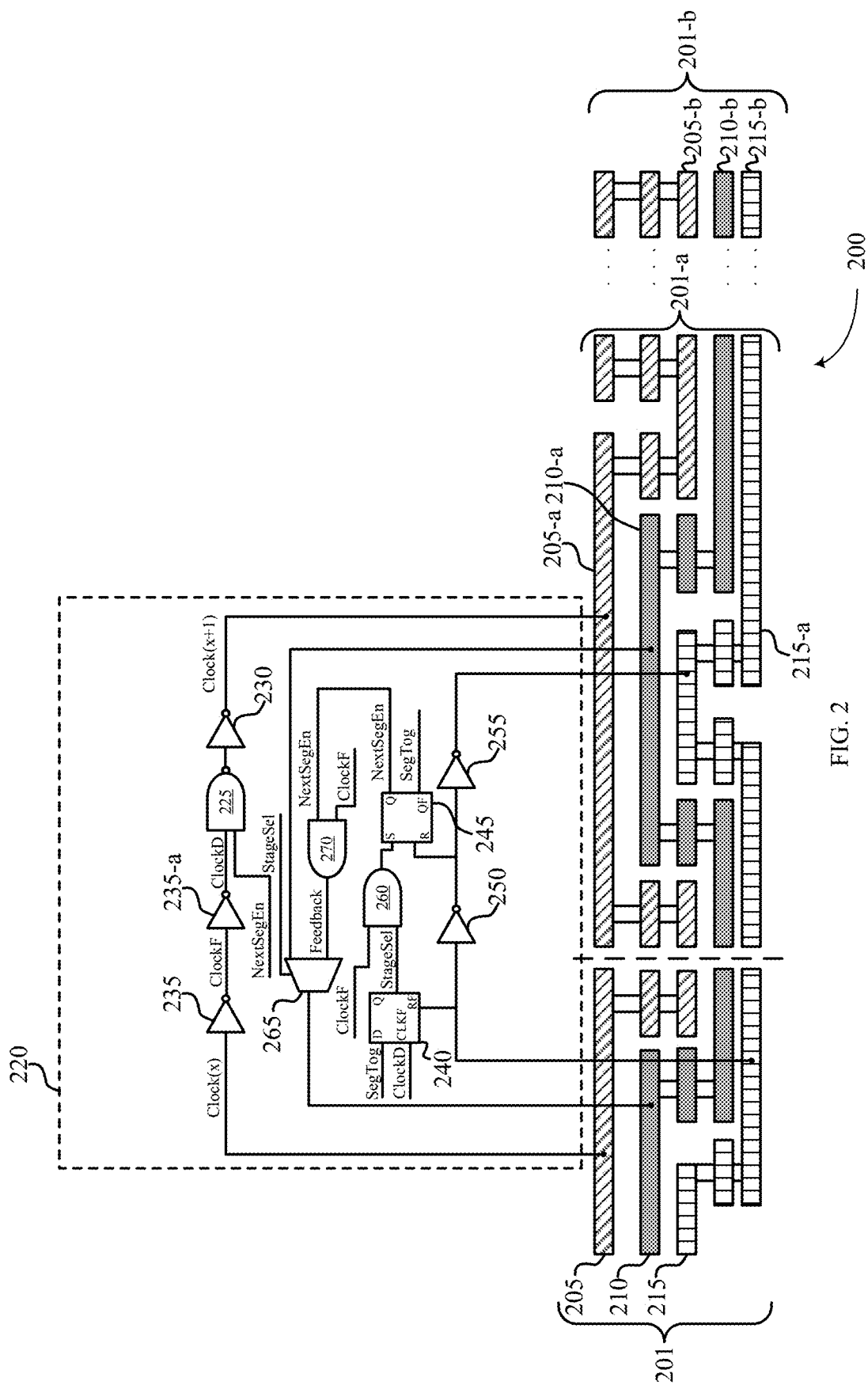

FIG. 2 illustrates aspects of an example of a segmented digital die ring 200 in accordance with examples of the present disclosure. Segmented digital die ring 200 may include multiple signal line segments depicted from a cross-sectional view. For example, segmented die ring 200 may include signal line segment 201 and signal line segment 201-*a*, which may be examples of signal line segments 120-*a* and 120-*b*, respectively, as described with reference to FIG. 1. Each of signal line segments 201 and 201-*a* may be coupled with test segment circuit 220, which may be an example of test segment circuit 110-*a* as described with reference to FIG. 1. In some examples, segmented digital die ring 200 may include a plurality of signal line segments coupled with a plurality of test segment circuits. Thus signal line segment 201-*b* may represent a last signal line segment (e.g., signal line segment 120-*i* as described with reference to FIG. 1) of segmented digital die ring 200.

In some examples, aspects of each of signal line segments 201, 201-*a*, 201-*b* may be located in various layers of a die (e.g., die 101 as described with reference to FIG. 1). For example, signal line segment 201 may include clock line 205, status line 210, and enable line 215, where each line is coupled to the test segment circuit 220. The test segment circuit 220 may control test operations associated with signal line segments 201 and 201-a. In the examples described herein, the test segment circuit 220 may correspond to any one of the test segment circuits (e.g., test segment circuits 110-a, 110-b, 110-c, 110-d, 110-e, 110-f, 110-g, and 110-h) as described with reference to FIG. 1.

As described above, the test segment circuit 220 may be coupled with signal line segments 201 and 201-a. In some examples, the test segment circuit 220 may couple (e.g., may be configured to selectively couple or decouple) various signal lines (e.g., couple aspects of signal line segment 201 with aspects of signal line segment 201-a). For example, an enable signal may be transmitted to test segment circuit 220 via enable line 215 and a feedback signal may be returned to the control circuit (e.g., control circuit 105 as described with reference to FIG. 1) via status line 210. If no defects are associated with signal line segment 201, test segment circuit 220 may subsequently couple aspects of signal line segment 201 with aspects signal line segment 201-a and the testing procedures described above may continue (e.g., may progress to include signal line segment 201-a).

In some examples, the clock line 205 may be coupled with one or more components of the test segment circuit 220. For example, the clock line 205 may be coupled with at least one inverter (e.g., inverter 235) that provides a clock signal (e.g., ClockF) to the test segment circuit 220 based on a Clock(x) signal provided by clock line 205. The logic value of ClockF may be complementary to the logical value of the Clock(x) signal. For example, the Clock(x) signal may be '1V' and the ClockF signal may be '0V'. In some examples, an additional inverter 235-a may generate a delayed clock signal (e.g., ClockD) that may be delayed relative to the Clock(x) signal but have the same logic value.

A NAND gate 225 may be configured to receive the ClockD signal, and an output of the NAND gate 225 may be coupled with another inverter 230, which may be coupled with a portion of a second signal line segment (e.g., signal line segment 120-b as described with reference to FIG. 1) and configured to output a clock signal for the second signal line segment (e.g., Clock(x+1)). The clock line 205 may carry a clock signal that clocks the test segment circuit 220 in operation. The clock line 205 may be a clock signal (e.g., Clock(x)) that originates from an external system (e.g., tester circuit), or an internal system where that clock signal may be generated (e.g., control circuit 105). For example, the clock line 205 signal may be generated internally, when a test mode of the die is activated. In such a test mode, the clock line 205 signal may be received at the test segment circuit 220 from the internal or external system that generated a clock signal to provide as the clock line 205 signal.

In some examples, latch circuit 240 may be or may be referred to as a D latch circuit 240 and latch circuit 245 may be or may be referred to as a SR latch circuit 245. The enable line 215 may be coupled with latch circuit 240 as well as inverter 250, and the output of inverter 250 may be coupled with the second latch circuit 245 as well as inverter 255. In some examples, latch circuit 240 may be coupled with a portion of the segment line (e.g., the enable line 215 portion of signal line segment 120-a as described with reference to FIG. 1), and the output of inverter 255 may be coupled with a portion of a second (e.g., an additional) signal line segment (e.g., the enable line 215 portion of signal line segment 120-b as described with reference to FIG. 1). The enable line 215 may transmit an enable signal, which may enable testing of a segment line controlled by the test segment circuit 220. The enable signal may be a signal that is generated when a test mode is activated. For example, the enable signal may be generated at an external system, when a test mode of the die (e.g., die 101 as described with reference to FIG. 1) is activated. The enable signal may be received at the enable line 215 from, for example, the external system that generated the signal.

In some examples, the latch circuit 240 may receive input, and may output various signals related to controlling a test operation of the die. The latch circuit 240 may receive a SegTog signal, which may be generated by the latch circuit 245 as described below and may indicate that the test segment circuit 220 is to include a segment line of the die in a test operation. In some examples, the SegTog signal may be set to a "high" logical level (e.g., set to 1V) prior to a test operation, such that when an edge (e.g., a rising edge) of a clock signal is received at latch circuit 240, the "high" logical level may be latched. For example, the latch circuit 240 may receive a ClockD signal, as described above, and an enable signal, which may enable the test segment circuit 220 to test at least one segment line (e.g., signal line segment 120-a as described with reference to FIG. 1). The latch circuit 240 may output a segment line selection signal, which may also be referred to as a testing stage selection signal (e.g., a StageSel signal) to a AND gate 260, the output of which may be an input to the second latch circuit 245.

In some examples, the latch circuit 240 may also output the StageSel signal to an additional component of the test segment circuit 220, such as the multiplexer 265. The multiplexer 265 may be a two-to-one multiplexer, and the StageSel signal may control which input to the multiplexer 265 is output by the multiplexer 265 (e.g., which input is routed by the multiplexer 265 to the preceding segment line (e.g., signal line segment 201). While described in terms of a D latch circuit, it may be appreciated that any combination of circuitry or latch circuits that receives and sends the signals described herein to control a test operation may be utilized to perform the functionality of the latch circuit 240.

In some examples, the second latch circuit 245 may receive input based on the enable signal (e.g., an inverted version of the enable signal as output by inverter 250) and the clock signal (e.g., the output of AND gate 260, which may be based on the StageSel signal and the ClockF signal), and output various signals related to controlling a test operation of the die. The latch circuit 245 may output a NextSegEn signal. In some examples, the NextSegEn may be received at NAND gate 225 as described above, which may pass a clock signal (e.g., Clock(x+1)) to an adjacent segment line or an adjacent test segment circuit via the clock line 205. Additionally or alternatively, the NextSegEn signal may be received at AND gate 270, and the output of AND gate 270 may comprise a feedback signal which may indicate a status of the respective preceding signal line segment (e.g., signal line segment 201). While described in terms of an SR latch circuit, it may be appreciated that any combination of circuitry or latch circuits that receives and sends the signals described herein to control a test operation may be utilized to perform the functionality of the latch circuit 245.

Depending on the logic value of StageSel, which may control the operation of multiplexer 265, multiplexer 265 may either route the feedback signal output by AND gate 270 to a control circuit (e.g., control circuit 105 as discussed with reference to FIG. 1) via a status line 210, or may couple the subsequent signal line segment (e.g., signal line segment 201-a) with the preceding signal line segment (e.g., signal line segment 201). For example, one input to multiplexer 265 may be coupled with the status line of the subsequent line segment (e.g., signal line segment 201-a), and the output of multiplexer 265 may be coupled with the status line of the preceding line segment (e.g., signal line segment 201). Thus, when StageSel has a first logic value (e.g., a logic "0" value), multiplexer 265 may route the input coupled with the status line of the subsequent line segment (e.g., signal line segment 201-a) to the output of multiplexer 265.

This may result in the subsequent signal line segment (e.g., signal line segment 201-a) being coupled with the preceding signal line segment (e.g., signal line segment 201). And when StageSel has a second logic value (e.g., a logic "1" value), multiplexer 265 may route the input coupled with the output of AND gate 270 to the output of multiplexer 265. This may result in the feedback signal being routed to the control circuit (e.g., control circuit 105 as discussed with reference to FIG. 1) via the status line 210 of the preceding signal line segment (e.g., signal line segment 201) and the status lines of any additional preceding signal line segments.

In some examples, the second latch circuit 245 may also output a SegTog signal, which may be received at the first latch circuit 240, as described above. Receiving the SegTog signal at latch circuit 240 may alter a logical state of latch circuit 240. For example, the SegTog signal may be set to a "low" logical level (e.g., 0V) by the latch circuit 245, such that when an edge of a clock signal is received at latch circuit 240, the "low" logical level is latched by the latch circuit 240. In some examples, latching the "low" logical level may end a testing operation being conducted by test segment circuit 220 (e.g., may alter the state of StageSel and thus the state of multiplexer 265), configuring multiplexer 265 to couple the subsequent line segment (e.g., signal line segment 201-a) with the preceding line segment (e.g., signal line segment 201) rather than route the feedback signal generated by the AND gate 270. While described in terms of a SR latch circuit 245, it may be appreciated that any combination of circuitry or latch circuits that receives and sends the signals described herein to control a test operation may be utilized to perform the functionality of the latch circuit 245.

In some examples, the status line 210 may return (e.g., to control circuit 105 as described with reference to FIG. 1 (not shown)) a feedback signal associated with a particular signal line segment. As described above, the status line may be coupled with the output of multiplexer 265, the inputs of which may be coupled with a AND gate 270 and with the status line 210-a portion of the subsequent line segment 201-a.

As described above, the AND gate 270 may receive a NextSegEn signal from the second latch circuit 245 and a clock signal (e.g., ClockF). Based on receiving the NextSegEn signal, the AND gate 270 may generate a feedback signal, which when the multiplexer 265 is so configured by the StageSel signal, the multiplexer 265 may route to the control circuit 105. In some cases, the feedback signal may be a "high" (e.g., 1V) value or a "low" (e.g., 0V) value. In some examples, the a "high" value may indicate that no defects exist with the respective preceding signal line segment (or any other additional intervening line segments between the respective preceding signal line segment and the control circuit), and a "low" value may indicate that at least one defect exists with the respective preceding signal line segment. If the feedback signal associated with each intervening line segments was "high," then it may be determined that the defect is isolated to the respective preceding signal line segment. Upon returning the "high" value to the control circuit, the enable signal may be transmitted to a subsequent test segment circuit (e.g., via inverter 255, the output of which may be coupled with the enable line 215-a) to determine a condition of a subsequent signal line segment as described above.

In some examples, a die (e.g., die 101 as described with reference to FIG. 1) may not contain any defects. For example, as described with reference to FIG. 1, a clock signal and enable signal may be transmitted to each test segment circuit (e.g., test segment circuit 110-a to 110-i). Each test segment circuit may transmit a feedback signal to the control circuit (e.g., control circuit 105 as described with reference to FIG. 1) indicating that condition of a respective signal line segment is not associated with a defect.

In some examples, the clock line 205 may correspond to a topmost metal layer of the die. The metal layer may be an aluminum layer, for example. The clock line 205 may represent a conductive path (e.g., a single conductive path) to propagate a signal around the die. Some signal lines of the die may span one or more layers, which may be referred to as vertical segmentation of the die. For example, the die may be vertically segmented according to different signal lines described herein. Accordingly, the signal lines may form conductive paths within the die. In some examples, the enable line 215 may include several layers of the die, which may be or may include metal layers and/or polysilicon layers that form on the substrate of the die. As shown in FIG. 2, while the enable line 215 spans three layers, the line may carry additional signals, such as a "reset" signal, which may reset some values at the test segment circuit 220 coupled to the enable line 215. As shown in FIG. 2, some intermediate connections between the layers of the die may couple the layers to form a single conductive path for signal propagation on the enable line 215. For example, a "reset" signal may be activated at a different layer than the enable, but both signals may propagate along the single conductive path. In some examples, a "reset" signal may reset each latch circuit (e.g., latch circuit 240, 245) such that a value of the respective latch circuit is reset to a uniform value in each test segment circuit (e.g., a '0' value).

As described above, the test segment circuit 220 may be configured to generate a feedback signal based at least in part on a condition of a respective signal line segment. The testing of a condition of a respective signal line segment may include receiving a feedback signal at a control circuit (e.g., control circuit 105 as described with reference to FIG. 1). In some examples, multiple test segment lines (e.g., 201, 201-a) may be coupled with each other, which may result in multiple feedback signals being returned to the control circuit. As previously described, an output signal may be generated based on the feedback signal and the clock cycle, which may indicate a condition of one or more signal line segments. For example, a "high" output signal (e.g., 1V) may indicate that no defects are associated with a respective segment line. In other examples, a "low" output signal (e.g., 0V) may indicate that one or more defects are associated with the respective segment line.

Thus, the test segment circuit 220 may be configured to receive a clock signal 205 and an enable signal 210 via preceding signal line segment (e.g., signal line segment 201). In an initial state of operation (e.g., a first half of a cycle of the clock signal 205 or of a cycle based on the clock signal 205), the test segment circuit 220 may generate and transmit a feedback signal, which may also be referred to as a status signal, via status line 210. The test segment circuit 220 may transmit the of the preceding signal line segment (e.g., signal line segment 201) in the opposite direction in which the test segment circuit 220 received the clock signal 205 and the enable signal 210. In the initial state of operation of the test segment circuit 220, the feedback signal generated and transmitted by the test segment circuit 220 may be based on and thus indicative of a condition of the preceding signal line segment (e.g., signal line segment 201) because, in the event of a defect in the preceding signal line segment (e.g., signal line segment 201), the clock signal 205 and the enable signal 210 may not reach the test segment circuit 220 (and thus the test segment circuit 220 may not generate the feedback signal) or the feedback signal generated by the test segment circuit 220 may not reach a control circuit 105 via status line 210.

If preceding test segment circuits (that is, test segment circuits in between test segment circuit 220 and the control circuit 105) generate feedback signals that are successfully received by the control circuit 105, and test segment circuit 220 does not generate a feedback signal that is successfully received by the control circuit 105, it may be determined (e.g., by the control circuit 105 or by an external device operating the segment digital die ring 200) that a defect in the die is localized to signal line segment 201. Conversely, if test segment circuit 220 does generate a feedback signal that is successfully received by the control circuit 105, it may be determined (e.g., by the control circuit 105 or by an external device operating the segment digital die ring 200) that signal line segment 201 and any preceding line segments are defect-free.

In a subsequent state of operation (e.g., a second half of a cycle of the clock signal 205 or of a cycle based on the clock signal 205), the test segment circuit 220 may generate an enable signal for a subsequent test segment circuit (e.g., NextSegEn) and may generate a clock signal for the subsequent test segment circuit (e.g., Clock(x+1)) based on the enable signal for the subsequent test segment circuit. The test segment circuit 220 may transmit the clock signal for the subsequent test segment circuit and relay the enable signal received via the preceding line segment (or, alternatively, on the enable signal for the subsequent test segment circuit) to the subsequent test segment circuit. Also in the subsequent state of operation, the test segment circuit 220 may couple subsequent signal line segment (e.g., signal line segment 201-a) with the preceding signal line segment (e.g., via multiplexer 265) (e.g., based on the enable signal for the subsequent test segment circuit (e.g., NextSegEn)) and route back to the control circuit 105 any feedback signal received via the subsequent signal line segment (e.g., via status line 210-a).

Figure 3:
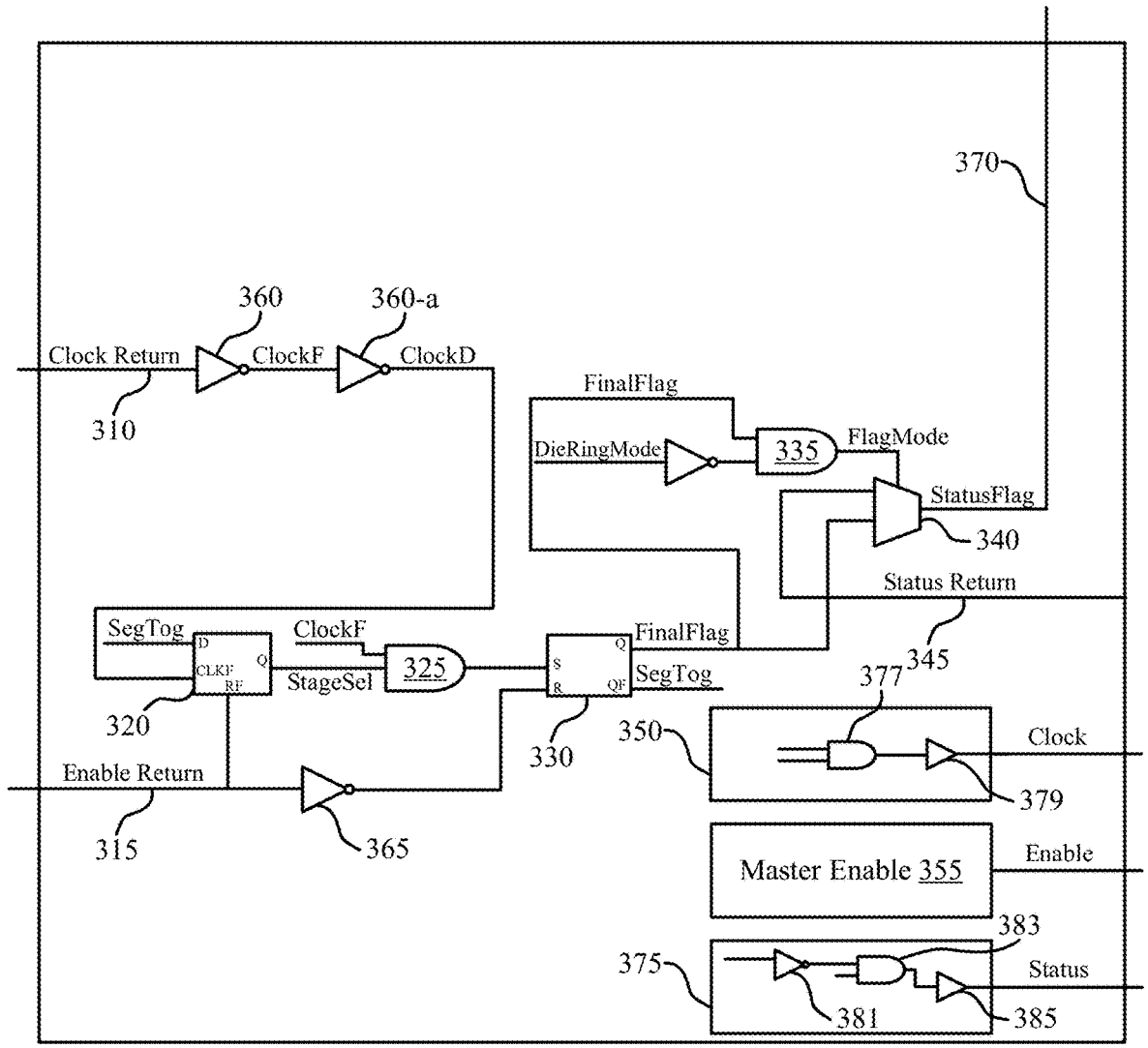
FIG. 3 illustrates an example of a control circuit in accordance with examples of the present disclosure.

FIG. 3 illustrates an example of a control circuit 300 of a segmented digital die ring in accordance with examples of the present disclosure. Control circuit 300 may be an example of control circuit 105 as described above with reference to FIG. 1. Control circuit 300 may include master clock component 350, master enable component 355, and master status component 375, which may transmit a clock signal, an enable signal, and a status signal, respectively, to a first signal line segment (e.g., to signal line segment 120-a as described with reference to FIG. 1). In some examples, master clock component 350 may include an AND gate 377 coupled with an amplifier 379. The inputs of the AND gate 377 may be, for example, a DieRingMode signal and a MasterClock signal, as described below. Master clock component 350 may output a clock signal (e.g., as shown in FIG. 3). Additionally or alternatively, master status component 375 may include an inverter 381 coupled with an AND gate 383 and an amplifier 385. In some examples, an input to the inverter 381 may be or may include the DieRingMode signal, and may output an inverted DieRingMode signal to one input of AND gate 383. In some examples, a second input of the AND gate 383 may be the MasterClock signal. Master status component 375 may output a status signal (e.g., as shown in FIG. 3). As described above with reference to FIG. 1, a clock signal, an enable signal, and a status signal may be transmitted around a die ring (e.g., a segmented digital die ring 100 as described with reference to FIG. 1 or a segmented digital die ring 200 as described with reference to FIG. 2). In some examples, control circuit 300 may receive a clock signal from clock line 310 and an enable signal from enable line 315, which may be associated with a last signal line segment (e.g., signal line segment 120-i as described with reference to FIG. 1) of a segmented digital die ring.

In some examples, control circuit 300 may receive a clock signal from clock line 310 and an enable signal from enable line 315. Receiving the clock signal and the enable signal may be based in part on the control circuit 300 transmitting a clock signal and an enable signal to a first signal line segment (e.g., to signal line segment 120-a). The clock signal may be transmitted from, for example, master clock component 350 and the enable signal may be transmitted from master enable component 355. As described with reference to FIG. 1, a first test segment circuit (e.g., test segment circuit 110-a) may receive the enable signal and may return a feedback signal indicating a condition associated with a respective signal line segment (e.g., signal line segment 120-a). The test segment circuit may also couple the preceding signal line segment (e.g., signal line segment 120-a) with a subsequent signal line segment (e.g., signal line segment 120-b) such that the clock signal and the enable signal may be transmitted to a subsequent test segment circuit (e.g., to test segment circuit 110-b).

In some examples, this process may continue such that a final signal line segment (e.g., signal line segment 120-i) may transmit the clock signal and the enable signal to the control circuit 300. As described above, the clock signal and the enable signal may be received by clock line 310 and enable line 315, respectively. These signals may be received at control circuit 300 (e.g., from signal line segment 120-i) when no defects (e.g., cracks) exist in the die. For example, if a defect were to exist in the die, a return feedback signal would indicate such, and the testing process (e.g., the transmission of the clock signal and the enable signal) may end.

In some examples, the clock line 310 may be coupled with at least one inverter (e.g., inverter 360) that provides a clock signal (e.g., ClockF) to the AND gate 325. In some examples, the logic value of ClockF may be complementary to the logical value of the received clock signal (e.g., received via clock line 310). For example, the received clock signal may be '1V' and the ClockF signal may be '0V'. In some examples, an additional inverter (e.g., inverter 360-a) may generate a delayed clock signal (e.g., ClockD) that may be delayed relative to the received clock signal (e.g., received via clock line 310) but have the same logic value.

In some examples, the enable line 315 may be coupled with a first latch circuit 320 and, by way of an intervening inverter 365, with a second latch circuit 330. Latch circuit 320 may be or may be referred to as a D latch circuit 320 and latch circuit 330 may be or may be referred to as a SR latch circuit 330. The enable line 315 may be coupled with latch circuit 320 as well as inverter 365, and the output of the inverter 365 may be coupled with the second latch circuit 330.

In some examples, the latch circuit 320 may receive input, and may output various signals related to controlling a test operation of the die. The latch circuit 320 may receive a SegTog signal, which may be output by the latch circuit 330. In some examples, the SegTog signal may be set to a "high" logical level (e.g., set to 1V) prior to the clock signal 310 and the enable signal 315 being received at the control circuit 105, such that when an edge (e.g., a rising edge) of a clock signal is received at latch circuit 320, the "high" logical level may be latched. For example, the latch circuit 320 may receive a ClockD signal, as described above, and an enable signal (e.g., via enable line 315). The latch circuit 320 may output a segment line selection signal, which may also be referred to as a testing stage selection signal (e.g., a StageSel signal) to an AND gate 325, the output of which may be an input to the second latch circuit 330. While described in terms of a D latch circuit 320, it may be appreciated that any combination of circuitry or latch circuits that receives and sends the signals described herein to control a test operation may be utilized to perform the functionality of the latch circuit 320.

In some examples, the second latch circuit 330 may receive input based on the enable line 315 and the output of AND gate 325, which may be based on the StageSel signal and the ClockF signal. Due to inverter 365, the second latch circuit 330 may receive an inverted version of the enable line 315 output by the inverter 365, and may output various signals related to controlling other aspects of the control circuit 300. For example, along with the SegTog signal, the latch circuit 330 may output a signal to indicate completion of a test sequence for a segmented digital die ring, which may be referred to as a FinalFlag signal, and which may generated based on the control circuit 300 receiving the clock signal and the enable signal from a final signal line segment.

In some examples, the FinalFlag signal may be received at AND gate 335, along with an inverted version of the DieRingMode signal. As described below with reference to FIG. 4, at the onset of a test operation, the DieRingMode signal is driven to a "high" level (e.g., to 1V). An inverted version of the DieRingMode signal may be, for example, 0V. Thus, as the FinalFlag signal and an inverted version of the DieRingMode signal may be received at AND gate 335, the output of AND gate 335 may have the same logic value as the FinalFlag signal so long as DieRingMode is high. The output of AND gate 335 may be referred to as a FlagMode signal and may control multiplexer 340.

The multiplexer 340 may be a two-to-one multiplexer, and the FlagMode signal may control which input to the multiplexer 340 is output by the multiplexer 340. In some examples, the multiplexer 340 may receive input from second latch circuit 330 (e.g., a FinalFlag signal), and a return feedback signal 345. The return feedback signal 345 may be referred to as a StatusReturn signal 345 and may be received from one or more test segment circuits (e.g., from test segment circuit 110-a as described with reference to FIG. 1, which may also correspond to the output of a multiplexer 265 as described with reference to FIG. 2). As described above, each test segment circuit may receive a clock signal and an enable signal, and may return a feedback signal that indicates a condition of a respective signal line segment. For example, as described with reference to FIG. 1, test segment circuit 110-a may receive a clock signal and an enable signal and may return a feedback signal indicating a condition of signal line segment 120-a. Thus return feedback signal 345 may return feedback from multiple test segment circuits and may toggle between a "high" value (e.g., 1V) and a "low" value (e.g., 0V).

Accordingly, multiplexer 340 may output a single signal (e.g., a StatusFlag signal), reflecting either the FinalFlag signal or the return feedback signal 345, depending on the state of the FlagMode signal. Thus, until the FlagMode signal takes on the logic value that selects the FinalFlag signal input to the multiplexer 340, the StatusFlag signal may reflect the return feedback signal 345—that is, the state of the StatusFlag signal may reflect the feedback signal generated and transmitted by a first test segment circuits, then reflect the feedback signal generated and transmitted by a second test segment circuits, and so on, and thus reflect the condition of associated signal line segments.

Once the FlagMode signal takes on the logic value that selects the FinalFlag signal input to the multiplexer 340 (e.g., once signals carried by the clock line 310 and enable line 315 reach control circuit 300, and the output of the second latch circuit 330 changes logic value), the StatusFlag signal may reflect the FinalFlag signal. Thus, if the StatusFlag signal is configured to have a "high" value (e.g., 1V) once a test sequence is complete, then the StatusFlag signal may be latched into having a high value once the test sequence is complete. Stated another way, clock line 310 and enable line 315 may return a clock signal and a control signal to control circuit 300 when the respective signals are transmitted around the entire segmented digital die ring (e.g., the die contains no defects). Accordingly, the FinalFlag signal may be generated only when the die contains no defects, and may be used in generating the StatusFlag signal. When the die contains no defects, the StatusFlag signal is output to output line 370, which may output a "high" value (e.g., 1V) (or, in other examples, a low value) to indicate no defects exist. The StatusFlag signal may correspond to an output signal 115 as discussed in reference to FIG. 1, or an output signal 115 as discussed in reference to FIG. 1 may be based on the StatusFlag signal.

Thus, the control circuit 300 may be configured to transmit to a first test segment circuit via a first signal line segment and in a first direction a clock signal (e.g., master clock 350) and an enable signal (e.g., master enable 355) and to receive in a second, different direction via (at least in part) the first signal line segment a feedback signal (e.g., feedback signal 345), the feedback signal based at least in part on a condition of one or more signal line segments traversed by the feedback signal (e.g., based on a condition of a first signal line segment during a first cycle of the clock signal, then based on a condition of the first signal line segment and a second segment line segment during a second cycle of the clock signal, then based on a condition of the first signal line segment and the second segment line segment and a third signal line segment during a third cycle of the clock signal, and so on). The control circuit may be configured to generate or drive (e.g., modify the state of) an output signal 115 based on the feedback signal (e.g., feedback signal 345).

The control circuit 300 may also be configured to receive a clock signal and an enable signal via clock line 310 and enable line 315 respectively, once the clock signal (e.g., master clock 350) and the enable signal (e.g., master enable 355), or at least signals based thereupon, have traversed the entirety of a segmented digital die ring. The control circuit may be configured to then alter (e.g., modify the state of) the output signal 115 to reflect a successful completion of a test sequence (e.g., to reflect the value of a FinalFlag signal).

Figure 4:
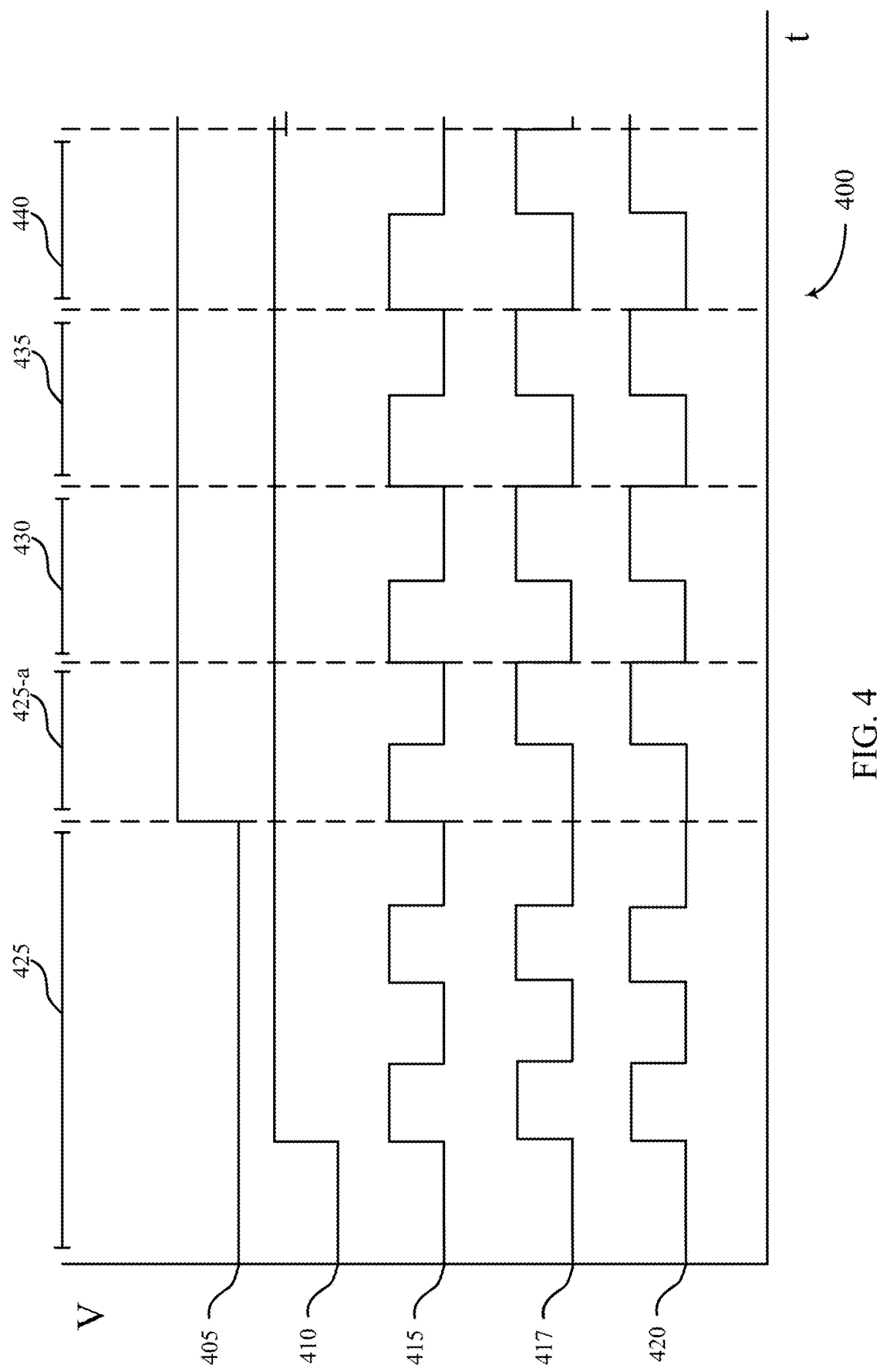
FIG. 4 shows a timing diagram that illustrates testing a digital die ring in accordance with examples of the present disclosure.

FIG. 4 shows a timing diagram 400 that illustrates testing a digital die ring in accordance with examples of the present disclosure. In some examples, timing diagram 400 includes die ring mode signal 405, master enable signal 410, clock signal 415, output signal 417, and final output signal 420.

Die ring mode signal 405 may enable master clock 350 as described with reference to FIG. 3, master enable signal 410 may correspond to master enable 355 as described with reference to FIG. 3, clock signal 415 may correspond to master clock 350 as described with reference to FIG. 3, output signal 417 may correspond to StatusFlag as described with reference to FIG. 3, and final output signal 420 may correspond to output signal 115 as described with reference to FIG. 1.

In some examples, an initial pre-test may occur. For example, interval 425 may represent an initial pre-test, which may be referred to as flow-through mode. During an initial pre-test, each signal line segment may be coupled to a subsequent signal line segment by a intervening test segment circuit (e.g., a first signal line segment 120-*a* coupled with a second signal line segment 120-*b* by a first test segment circuit 110-*a*, as described with reference to FIG. 1) while the die ring mode signal 405 remains "low." In some cases, the master enable signal 410 may be driven to a "high" level, and each test segment circuit may be configured to have a preliminary state of coupling (e.g., via a multiplexer) adjacent signal line segments, and may switch to a state of isolating the adjacent signal line segments (e.g., by switching an active input of the multiplexer) upon an enable signal reaching the test segment circuit, and may switch to again coupling (e.g., via a multiplexer) the adjacent signal line segments after generating and returning a feedback signal.

With all signal line segments coupled, the clock signal 415 may be transmitted around the segmented digital die ring (e.g., around each coupled signal line segment and returned to the control circuit). The resulting output signal 417 may be monitored to determine whether the die contains a defect. For example, if the output signal 417 tracks the clock cycle, the die may not contain a defect (e.g., a crack). If the output signal 417 does not track the clock cycle, this may indicate that the die contains a defect (e.g., a crack). As another example, additionally or alternatively, if the final output signal 420 latches to a predetermined value (e.g., high or low) from an initial value (e.g., low or high), this may indicate that the die does not contain a defect (e.g., a crack), and if the final output signal 420 does not change to the predetermined value, this may indicate that the die contains a defect (e.g., a crack). However, during an initial pre-test, a location of the defect may be unknown due to feedback signals not being received from individual test segment circuits.

At interval 425-*a* a test mode associated with a digital die ring of a die (e.g., die 101 as described with reference to FIG. 1) may be initiated. In some examples, a test mode that begins at interval 425-*a* may be referred to as a status feedback mode. As described above, the test mode may indicate whether a respective signal line segment (e.g., signal line segment 120-*a* as described with reference to FIG. 1) is associated with a defect (e.g., a crack). At the onset of the test mode, the die ring mode signal 405 and the master enable signal 410 may be driven to a "high" level to begin the testing operation. The clock cycle may be transmitted to a first test segment circuit (e.g., test segment circuit 110-*a* as described with reference to FIG. 1) via a first signal line segment (e.g., signal line segment 120-*a* as described with reference to FIG. 1). The clock signal may be received at the first test segment circuit. As described above, when the clock signal is received, the test segment circuit may generate a feedback signal indicating a condition of the associated signal line segment. As shown in FIG. 4, the output signal 417 received at the control circuit during interval 425-*a* toggles to a "high" output level, indicating that the respective signal line segment is not associated with a defect. The first test segment circuit may operate as described above in reference to FIG. 2, and the clock signal may subsequently be transmitted to an additional test segment circuit via a subsequent signal line segment, and the output signal 417 may toggle to a "low" output level (e.g., at interval 430).

At interval 430 the test mode may continue, as the die ring mode signal 405 and the master enable signal 410 remain at a "high" level. The clock cycle may be transmitted to a second test segment circuit (e.g., test segment circuit 110-*b* as described with reference to FIG. 1) via a second signal line segment (e.g., signal line segment 120-*b* as described with reference to FIG. 1). The clock signal may be received at the second test segment circuit. The test segment circuit may generate a feedback signal indicating a condition of the associated signal line segment. As shown in FIG. 4, the output signal 417 received at the control circuit during interval 430 toggles to a "high" output level, indicating that the respective signal line segment is not associated with a defect. The first test segment circuit may operate as described above in reference to FIG. 2, and the clock signal may subsequently be transmitted to an additional test segment circuit via a subsequent signal line segment, and the output signal 417 may toggle to a "low" output level (e.g., at interval 435).

At interval 435 the test mode may continue, as the die ring mode signal 405 and the master enable signal 410 remain at a "high" level. The clock cycle may be transmitted to a third test segment circuit (e.g., test segment circuit 110-*c* as described with reference to FIG. 1) via a third signal line segment (e.g., signal line segment 120-*c* as described with reference to FIG. 1). The clock signal may be received at the third test segment circuit. The test segment circuit may generate a feedback signal indicating a condition of the associated signal line segment. As shown in FIG. 4, the output signal 417 received at the control circuit during interval 435 toggles to a "high" output level, indicating that the respective signal line segment is not associated with a defect. The first test segment circuit may operate as described above in reference to FIG. 2, and the clock signal may subsequently be transmitted to an additional test segment circuit via a subsequent signal line segment, and the output signal 417 may toggle to a "low" output level (e.g., at interval 440).

At interval 440 the test mode may continue, as the die ring mode signal 405 and the master enable signal 410 remain at a "high" level. For purposes of illustration, the clock cycle may be transmitted to the third test segment circuit (e.g., test segment circuit 110-*c* as described with reference to FIG. 1) for a second time, as the fourth signal line segment (e.g., signal line segment 120-*d* as described with reference to FIG. 1) may complete a ring around the die. The clock signal may be received at the third test segment circuit. The test segment circuit may generate a feedback signal indicating a condition of the associated signal line segment. Because the signal line segment may be the final signal line segment of the die, the control circuit may generate a final output signal 420 (e.g., a FinalFlag signal as described above with reference to FIG. 3). In some examples, the final output signal 420 (e.g., FinalFlag signal) generated by the control circuit during interval 440 may be "high" output level, indicating that the die does not contain a defect (e.g., a crack). Thus, the final output signal 420 generated by the control circuit during interval 440 may be "high" output level, indicating that the die does not contain a defect (e.g., a crack). In other examples, if a defect (e.g., a crack) is associated with the final signal line segment (e.g., the fourth signal line segment; signal line segment 120-$d$ as described with reference to FIG. 1), one or more logic blocks associated with the control circuit may make the final output signal 420 (e.g., FinalFlag signal) act like a feedback signal for the final signal line segment. Thus, if a defect is associated with the final line segment, the FinalFlag signal may not be a "high" output level (e.g., rather, a "low" output signal). After interval 440, die ring mode signal 405 and the master enable signal 410 may be returned to a "low" level to end the test mode (not shown).

Figure 5:
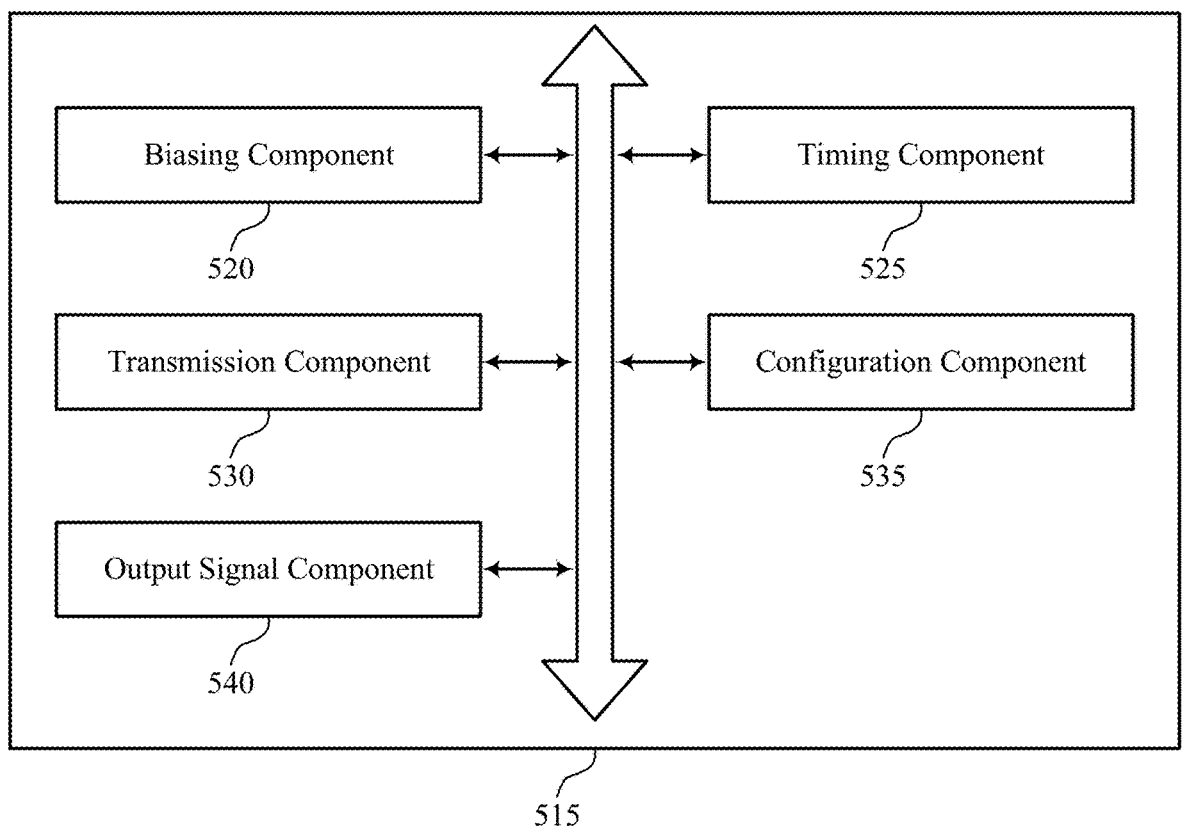
FIG. 5 shows a block diagram of a device that supports a segmented digital die ring in accordance with examples of the present disclosure.

FIG. 5 shows a block diagram 500 of a control circuit 515 that supports segmenting a digital die ring in accordance with examples of the present disclosure. The control circuit 515 may be an example of aspects of a control circuit 105 as described with reference to FIG. 1. The control circuit 515 may include biasing component 520, timing component 525, transmission component 530, configuration component 535, and output signal component 540.

Transmission component 530 may transmit the clock signal around the ring. In some examples, transmission component 530 may transmit a clock signal to a test segment circuit via a signal line segment. In other examples, transmission component 530 may transmit the clock signal to the test segment circuit, which may include transmitting the clock signal along a first signal route at a first level. Additionally or alternatively, transmission component 530 may transmit the clock signal to the second test segment circuit via the signal line segment and the second signal line segment. In some cases, the test segment circuit may be configured to return the feedback signal along a second signal route at a second level, where the second level is different from the first level.

Configuration component 535 may configure the test segment circuit to couple the signal line segment with a second signal line segment. In other examples, configuration component 535 may route a feedback signal of a subsequent signal line segment to a preceding signal line segment. In some examples, the signal line segment and the second signal line segment may be included in a set of signal line segments and configured to form a ring around a die. In some examples, configuration component 535 may configure the test segment circuit to return a feedback signal, where the feedback signal based on the clock signal and a condition of the signal line segment.

In other examples, configuration component 535 may configure the test segment circuit to couple the signal line segment with a second signal line segment, where the second signal line segment coupled with a second test segment circuit. Additionally or alternatively, configuration component 535 may configure the second test segment circuit to return a second feedback signal, where the second feedback signal based on the clock signal and the condition of the signal line segment. In some examples, configuring the test segment circuit to return the feedback signal may include transmitting an activation signal to the test segment circuit, where the test segment circuit configured to generate the feedback signal based on the activation signal and a state of the clock signal.

Output signal component 540 may generate an initial output signal based on transmitting the clock signal around the ring, where the initial output signal includes an indication of a condition of the die and generate an output signal based on the feedback signal, and where the output signal includes an indication of the condition of the signal line segment. In some examples, output signal component may modify the output signal, based on the feedback signal, to include an indication of the condition of the second signal line segment and the signal line segment.

Figure 6:
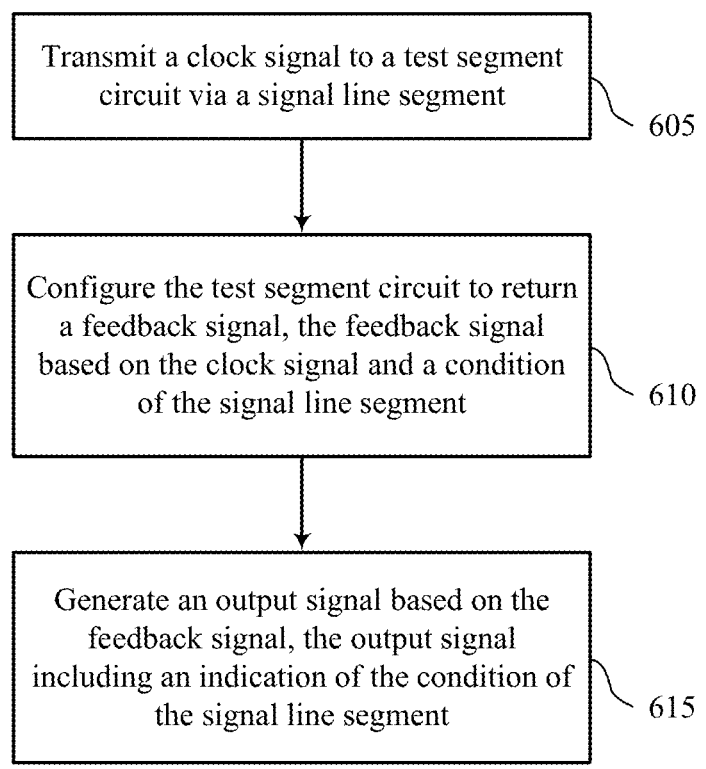
FIGS. 6 through 8 illustrate methods for segmenting a digital die ring in accordance with examples of the present disclosure.

FIG. 6 shows a flowchart illustrating a method 600 for segmenting a digital die ring in accordance with examples of the present disclosure. The operations of method 600 may be implemented by a control circuit or its components as described herein. For example, the operations of method 600 may be performed by a control circuit as described with reference to FIG. 1.

At 605 the control circuit may transmit a clock signal to a test segment circuit via a signal line segment. The operations of 605 may be performed according to the methods described herein. In certain examples, aspects of the operations of 605 may be performed by a transmission component as described with reference to FIG. 5.

At 610 the control circuit may configure the test segment circuit to return a feedback signal. In some examples, the feedback signal may be based at least in part on the clock signal and a condition of the signal line segment. The operations of 610 may be performed according to the methods described herein. In certain examples, aspects of the operations of 610 may be performed by a configuration component as described with reference to FIG. 5.

At 615 the control circuit may generate an output signal based at least in part on the feedback signal. In some examples, the output signal may include an indication of the condition of the signal line segment. The operations of 615 may be performed according to the methods described herein. In certain examples, aspects of the operations of 615 may be performed by an output signal component as described with reference to FIG. 5.

Figure 7:
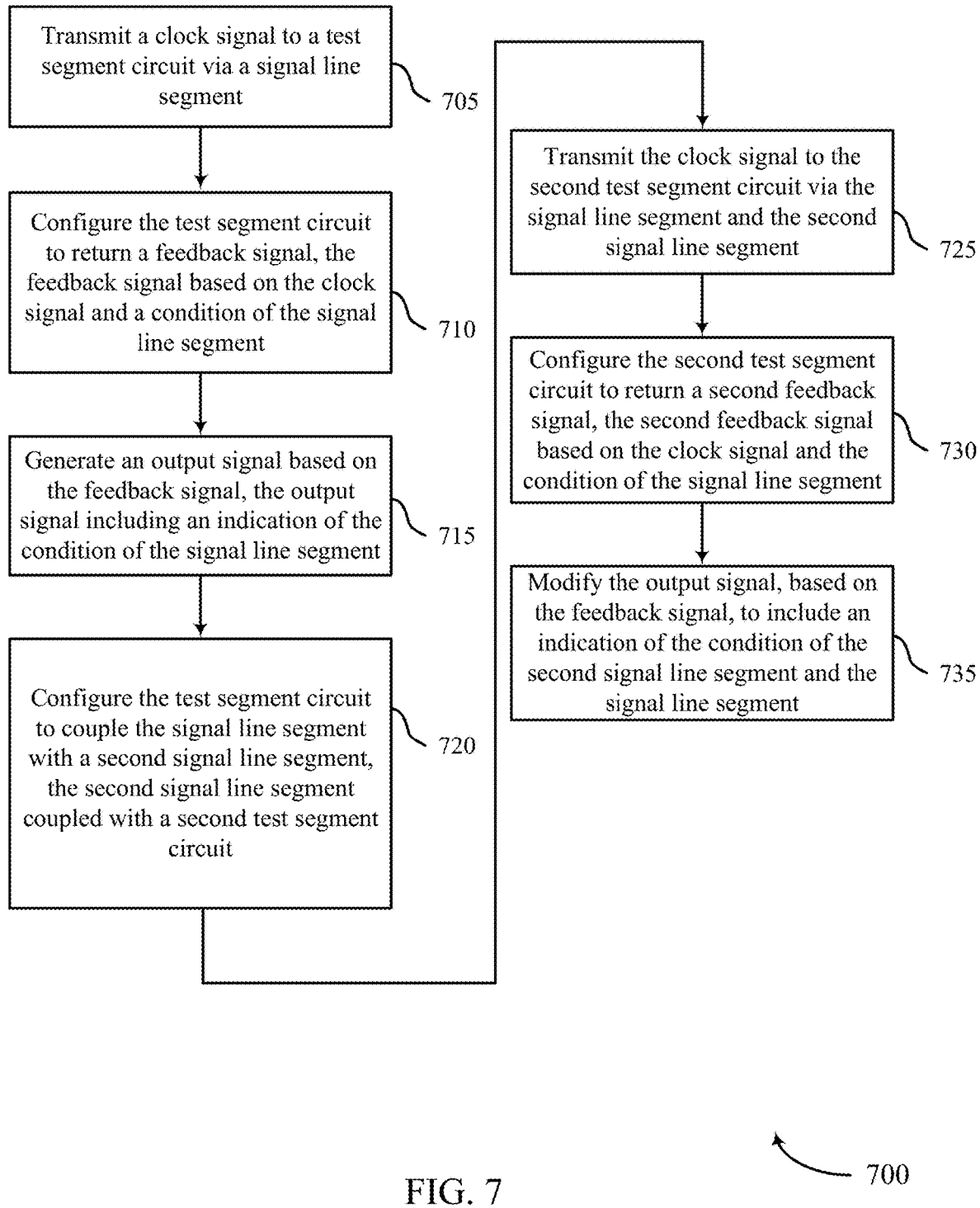

FIG. 7 shows a flowchart illustrating a method 700 for segmenting a digital die ring in accordance with examples of the present disclosure. The operations of method 700 may be implemented by a control circuit or its components as described herein. For example, the operations of method 700 may be performed by a control circuit as described with reference to FIG. 1.

At 705 the control circuit may transmit a clock signal to a test segment circuit via a signal line segment. The operations of 705 may be performed according to the methods described herein. In certain examples, aspects of the operations of 705 may be performed by a transmission component as described with reference to FIG. 5.

At 710 the control circuit may configure the test segment circuit to return a feedback signal. In some examples, the feedback signal may be based at least in part on the clock signal and a condition of the signal line segment. The operations of 710 may be performed according to the methods described herein. In certain examples, aspects of the operations of 710 may be performed by a configuration component as described with reference to FIG. 5.

At 715 the control circuit may generate an output signal based at least in part on the feedback signal. In some examples, the output signal may include an indication of the condition of the signal line segment. The operations of 715 may be performed according to the methods described herein. In certain examples, aspects of the operations of 715 may be performed by an output signal component as described with reference to FIG. 5.

At 720 the control circuit may configure the test segment circuit to couple the signal line segment with a second signal line segment. In some examples, the second signal line segment may be coupled with a second test segment circuit. The operations of 720 may be performed according to the methods described herein. In certain examples, aspects of the operations of 720 may be performed by a configuration component as described with reference to FIG. 5.

At 725 the control circuit may transmit the clock signal to the second test segment circuit via the signal line segment and the second signal line segment. The operations of 725 may be performed according to the methods described herein. In certain examples, aspects of the operations of 725 may be performed by a transmission component as described with reference to FIG. 5.

At 730 the control circuit may configure the second test segment circuit to return a second feedback signal. In some examples, the second feedback signal may be based at least in part on the clock signal and the condition of the signal line segment. The operations of 730 may be performed according to the methods described herein. In certain examples, aspects of the operations of 730 may be performed by a configuration component as described with reference to FIG. 5.

At 735 the control circuit may modify the output signal, based at least in part on the feedback signal, to include an indication of the condition of the second signal line segment and the signal line segment. The operations of 735 may be performed according to the methods described herein. In certain examples, aspects of the operations of 735 may be performed by an output signal component as described with reference to FIG. 5.

Figure 8:
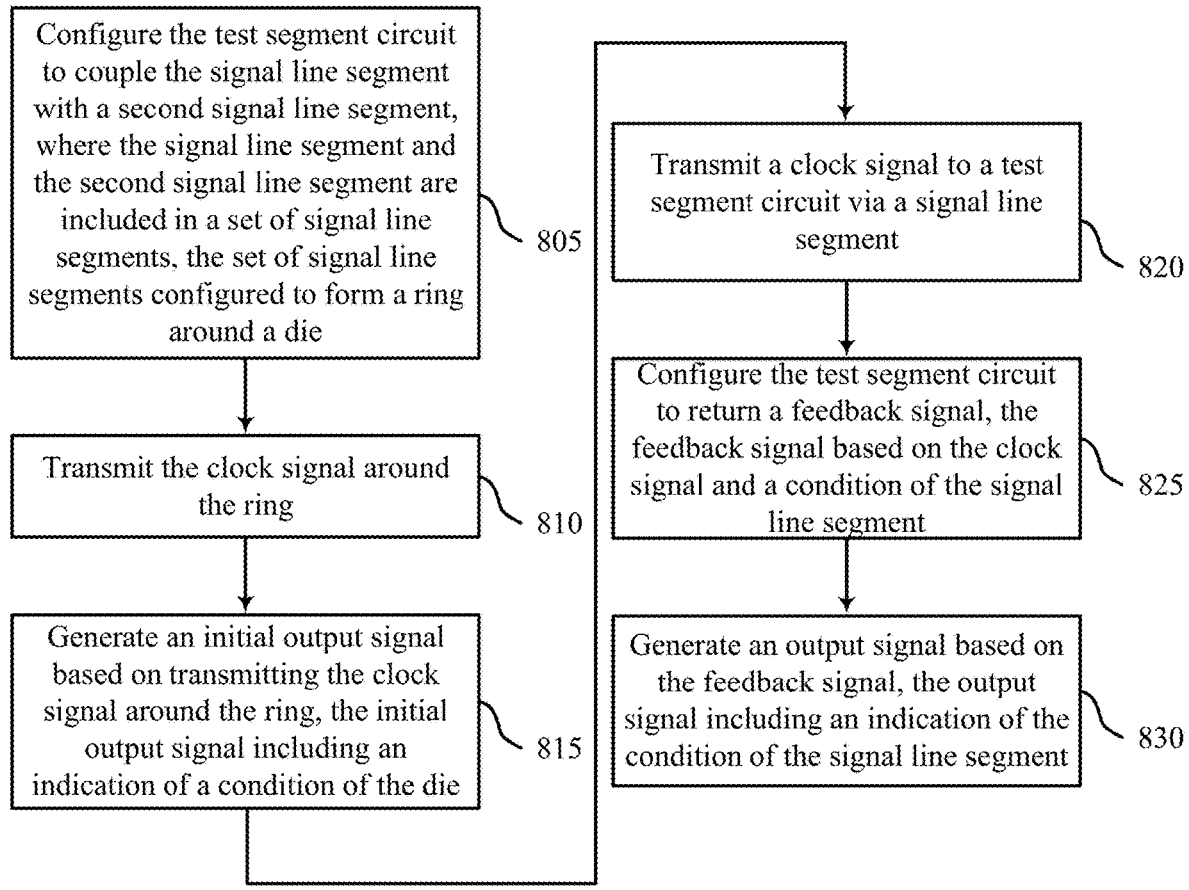

FIG. 8 shows a flowchart illustrating a method 800 for segmenting a digital die ring in accordance with examples of the present disclosure. The operations of method 800 may be implemented by a control circuit or its components as described herein. For example, the operations of method 800 may be performed by a control circuit as described with reference to FIG. 1.

At 805 the control circuit may configure the test segment circuit to couple the signal line segment with a second signal line segment. In some examples, the signal line segment and the second signal line segment may be included in a plurality of signal line segments, where the plurality of signal line segments configured to form a ring around a die. The operations of 805 may be performed according to the methods described herein. In certain examples, aspects of the operations of 805 may be performed by a configuration component as described with reference to FIG. 5.

At 810 the control circuit may transmit the clock signal around the ring. The operations of 810 may be performed according to the methods described herein. In certain examples, aspects of the operations of 810 may be performed by a transmission component as described with reference to FIG. 5.

At 815 the control circuit may generate an initial output signal based at least in part on transmitting the clock signal around the ring. In some examples, the initial output signal may include an indication of a condition of the die. The operations of 815 may be performed according to the methods described herein. In certain examples, aspects of the operations of 815 may be performed by an output signal component as described with reference to FIG. 5.

At 820 the control circuit may transmit a clock signal to a test segment circuit via a signal line segment. The operations of 820 may be performed according to the methods described herein. In certain examples, aspects of the operations of 820 may be performed by a transmission component as described with reference to FIG. 5.

At 825 the control circuit may configure the test segment circuit to return a feedback signal. In some examples, the feedback signal may be based at least in part on the clock signal and a condition of the signal line segment. The operations of 825 may be performed according to the methods described herein. In certain examples, aspects of the operations of 825 may be performed by a configuration component as described with reference to FIG. 5.

At 830 the control circuit may generate an output signal based at least in part on the feedback signal. In some examples, the output signal comprising an indication of the condition of the signal line segment. The operations of 830 may be performed according to the methods described herein. In certain examples, aspects of the operations of 830 may be performed by an output signal component as described with reference to FIG. 5.

In some examples, the method may include transmitting a clock signal to a test segment circuit via a signal line segment. The method may include configuring the test segment circuit to return the feedback signal, which may include transmitting an activation signal to the test segment circuit. In some examples, the test segment circuit may be configured to generate the feedback signal based at least in part on the activation signal and a state of the clock signal. Additionally or alternatively, the method may include generating an output signal based at least in part on the feedback signal. The output signal may include an indication of the condition of the signal line segment.

In some cases, the method may include transmitting the clock signal to the test segment circuit by transmitting the clock signal along a first signal route at a first level. In some examples, the test segment circuit may be configured to return the feedback signal along a second signal route at a second level, where the second level different from the first level. In other examples, the method may include configuring the test segment circuit to couple the signal line segment with a second signal line segment. The second signal line segment may be coupled with a second test segment circuit. In some cases, the method may include configuring the test segment circuit to return a feedback signal, where the feedback signal based at least in part on the clock signal and a condition of the signal line segment.

In some examples, the method may include configuring the second test segment circuit to return a second feedback signal, where the second feedback signal based at least in part on the clock signal and the condition of the signal line segment. In some cases, the method may include modifying the output signal, based at least in part on the feedback signal, to include an indication of the condition of the second signal line segment and the signal line segment. Additionally or alternatively, the method may include configuring the test segment circuit to couple the signal line segment with a second signal line segment, where the signal line segment and the second signal line segment are included in a plurality of signal line segments. In some examples, the plurality of signal line segments may be configured to form a ring around a die.

In some cases, the method may include transmitting the clock signal around the ring. In other examples, the method may include generating an initial output signal based at least in part on transmitting the clock signal around the ring, where the initial output signal includes an indication of a condition of the die. In some examples, the method may include transmitting the clock signal to the second test segment circuit via the signal line segment and the second signal line segment.

In other examples, an apparatus described herein may include means for transmitting the clock signal to the test segment circuit by transmitting the clock signal along a first signal route at a first level. In other examples, an apparatus described herein may include means for returning the feedback signal along a second signal route at a second level, the second level different from the first level.

In other examples, an apparatus described herein may include means for configuring the test segment circuit to couple the signal line segment with a second signal line segment, the second signal line segment coupled with a second test segment circuit. In some examples, an apparatus described herein may include means for transmitting the clock signal to the second test segment circuit via the signal line segment and the second signal line segment. Additionally or alternatively, an apparatus described herein may include means for configuring the second test segment circuit to return a second feedback signal, the second feedback signal based at least in part on the clock signal and the condition of the signal line segment. In other examples, an apparatus described herein may include means for modifying the output signal, based at least in part on the feedback signal, to include an indication of the condition of the second signal line segment and the signal line segment.

In other examples, an apparatus described herein may include means for configuring the test segment circuit to couple the signal line segment with a second signal line segment, wherein the signal line segment and the second signal line segment may be included in a plurality of signal line segments, the plurality of signal line segments configured to form a ring around a die. In some examples, an apparatus described herein may include means for transmitting the clock signal around the ring. Additionally or alternatively, an apparatus described herein may include means for generating an initial output signal based at least in part on transmitting the clock signal around the ring, the initial output signal including an indication of a condition of the die.

In some examples, an apparatus described herein may include a signal line segment, a test segment circuit coupled with the signal line segment, the test segment circuit configured to generate a feedback signal based at least in part on a condition of the signal line segment, and a control circuit coupled with the signal line segment, the control circuit configured to transmit a clock signal to the test segment circuit and receive the feedback signal based at least in part on transmitting the clock signal. In some examples, the apparatus described herein may include a second signal line segment, the second signal line segment coupled with the test segment circuit. In some examples, the apparatus described herein may include a second test segment circuit coupled with the second signal line segment, the second test segment circuit configured to generate a second feedback signal based at least in part on a condition of the second signal line segment.

In some examples of the apparatus described herein, the test segment circuit may be further configured to isolate the signal line segment from the second signal line segment based at least in part on the clock signal. Some examples of the apparatus described above may also include generating the feedback signal based at least in part on isolating the signal line segment from the second signal line segment.

In some examples of the apparatus described herein, the test segment circuit may be further configured to couple the signal line segment with the second signal line segment based at least in part on the clock signal. Some examples of the apparatus described above may also include routing the second feedback signal from the second test segment circuit to the control circuit based at least in part on coupling the signal line segment with the second signal line segment.

In some examples of the apparatus described herein, the test segment circuit comprises a multiplexer configured to isolate the signal line segment from the second signal line segment or route the feedback signal to the control circuit based at least in part on a digital segment selection signal.

In some examples of the apparatus described herein, the test segment circuit may be further configured to receive an activation signal generated by the control circuit. Some examples of the apparatus described above may also include generating the digital segment selection signal based at least in part on the clock signal and the activation signal.

In some examples of the apparatus described herein, the signal line segment and the second signal line segment may be included in a plurality of signal line segments, the plurality of signal line segments configured to form a ring around a die.

In some examples of the apparatus described herein, the control circuit may be configured to transmit the clock signal in a first direction, the first direction away from the control circuit. In some examples of the apparatus described herein, the test segment circuit may be configured to transmit the feedback signal in a second direction, the second direction towards the control circuit and different from the first direction. In some examples of the apparatus described herein, the clock signal and the feedback signal may be transmitted concurrently.

In some examples of the apparatus described herein, the control circuit may be configured to transmit the clock signal along a first signal route. In some examples of the apparatus described herein, the test segment circuit may be configured to transmit the feedback signal along a second signal route, the second signal route different from the first signal route.

In some examples of the apparatus described herein, the condition of the signal line segment comprises an existence of a defect or an absence of the defect associated with the signal line segment. In some examples of the apparatus described herein, the feedback signal comprises at least one of a first state or a second state, the first state indicating the existence of the defect and the second state indicating an absence of the defect.

It should be noted that the methods described above describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including segmented digital die ring 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein or as included in components discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a signal line segment;
a test segment circuit coupled with the signal line segment, the test segment circuit configured to generate a feedback signal based at least in part on a condition of the signal line segment;
a second signal line segment coupled with the test segment circuit;
a second test segment circuit coupled with the second signal line segment, the second test segment circuit configured to generate a second feedback signal based at least in part on a condition of the second signal line segment; and
a control circuit coupled with the signal line segment, the control circuit configured to transmit a clock signal to the test segment circuit and receive the feedback signal based at least in part on transmitting the clock signal.

2. The apparatus of claim 1, wherein the test segment circuit is further configured to:
isolate the signal line segment from the second signal line segment based at least in part on the clock signal; and
generate the feedback signal based at least in part on isolating the signal line segment from the second signal line segment.

3. The apparatus of claim 2, wherein the test segment circuit is further configured to:
couple the signal line segment with the second signal line segment based at least in part on the clock signal; and
route the second feedback signal from the second test segment circuit to the control circuit based at least in part on coupling the signal line segment with the second signal line segment.

4. The apparatus of claim 1, wherein the test segment circuit comprises:
a multiplexer configured to isolate the signal line segment from the second signal line segment or route the feedback signal to the control circuit based at least in part on a digital segment selection signal.

5. The apparatus of claim 4, wherein the test segment circuit is further configured to:
receive an activation signal generated by the control circuit; and
generate the digital segment selection signal based at least in part on the clock signal and the activation signal.

6. The apparatus of claim 1, wherein the signal line segment and the second signal line segment are included in a plurality of signal line segments, the plurality of signal line segments configured to form a ring around a die.

7. The apparatus of claim 1, wherein:
the control circuit is configured to transmit the clock signal in a first direction, the first direction away from the control circuit; and
the test segment circuit is configured to transmit the feedback signal in a second direction, the second direction towards the control circuit and different from the first direction.

8. The apparatus of claim 7, wherein the clock signal and the feedback signal are transmitted concurrently.

9. The apparatus of claim 1, wherein:
the control circuit is configured to transmit the clock signal along a first signal route; and
the test segment circuit is configured to transmit the feedback signal along a second signal route, the second signal route different from the first signal route.

10. The apparatus of claim 1, wherein:
the condition of the signal line segment comprises an existence of a defect or an absence of the defect associated with the signal line segment; and
the feedback signal comprises at least one of a first state or a second state, the first state indicating the existence of the defect and the second state indicating an absence of the defect.

11. A method, comprising:
transmitting a clock signal to a test segment circuit in a first direction via a signal line segment;
configuring the test segment circuit to return a feedback signal in a second direction different than the first direction, the feedback signal based at least in part on the clock signal and a condition of the signal line segment; and
generating an output signal based at least in part on the feedback signal, the output signal comprising an indication of the condition of the signal line segment.

12. The method of claim 11, wherein:
transmitting the clock signal to the test segment circuit comprises transmitting the clock signal along a first signal route at a first level; and
the test segment circuit is configured to return the feedback signal along a second signal route at a second level, the second level different from the first level.

13. The method of claim 11, further comprising:
configuring the test segment circuit to couple the signal line segment with a second signal line segment, the second signal line segment coupled with a second test segment circuit;
transmitting the clock signal to the second test segment circuit via the signal line segment and the second signal line segment;
configuring the second test segment circuit to return a second feedback signal, the second feedback signal based at least in part on the clock signal and the condition of the signal line segment; and
modifying the output signal, based at least in part on the feedback signal, to comprise an indication of the condition of the second signal line segment and the signal line segment.

14. The method of claim 11, further comprising:
configuring the test segment circuit to couple the signal line segment with a second signal line segment, wherein the signal line segment and the second signal line segment are included in a plurality of signal line segments, the plurality of signal line segments configured to form a ring around a die;
transmitting the clock signal around the ring; and
generating an initial output signal based at least in part on transmitting the clock signal around the ring, the initial output signal comprising an indication of a condition of the die.

15. The method of claim 11, wherein configuring the test segment circuit to return the feedback signal comprises:
transmitting an activation signal to the test segment circuit, the test segment circuit configured to generate the feedback signal based at least in part on the activation signal and a state of the clock signal.

16. An apparatus, comprising:
a plurality of signal line segments coupled with a plurality of test segment circuits, each of the plurality of test segment circuits disposed on a die and configured to generate a feedback signal based at least in part on a condition of a respective signal line segment; and a control circuit coupled with at least a first signal line segment of the plurality of signal line segments, the control circuit configured to transmit a clock signal in a first direction to at least a first test segment circuit of the plurality of test segment circuits and receive in a second direction different than the first direction a feedback signal from at least the first test segment circuit based at least in part on transmitting the clock signal.

17. The apparatus of claim 16, wherein:

the control circuit is further configured to receive a respective feedback signal from each of the plurality of test segment circuits according to a sequential order of the test segment circuits; and each of the respective feedback signals indicates an existence or an absence of a defect of at least the respective test segment.

18. The apparatus of claim 17, wherein each of the plurality of test segment circuits comprises a multiplexer configured to:

couple a preceding signal line segment of the plurality of signal line segments with a subsequent signal line segment of the plurality of signal line segments based at least in part on a first state of the clock signal; and route a feedback signal of the subsequent signal line segment to the preceding signal line segment based at least in part on a second state of the clock signal.

19. The apparatus of claim 17, wherein the control circuit is configured to generate a single output signal based at least in part on receiving each of the plurality of feedback signals.

* * * * *